(12) United States Patent
Brick et al.

(10) Patent No.: US 7,646,799 B2
(45) Date of Patent: Jan. 12, 2010

(54) EDGE EMITTING SEMICONDUCTOR LASER COMPRISING A PLURALITY OF MONOLITHICALLY INTEGRATED LASER DIODES

(75) Inventors: Peter Brick, Regensburg (DE); Johann Luft, Wolfsegg (DE); Martin Müller, Regenstauf (DE); Marc Philippens, Regensburg (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 83 days.

(21) Appl. No.: 11/904,060

(22) Filed: Sep. 25, 2007

(65) Prior Publication Data

US 2008/0123710 A1    May 29, 2008

(30) Foreign Application Priority Data

Sep. 28, 2006   (DE)   .................. 10 2006 046 036
Dec. 27, 2006   (DE)   .................. 10 2006 061 532

(51) Int. Cl.
*H01S 5/00*   (2006.01)
(52) U.S. Cl. ...................................... 372/121; 372/50.1
(58) Field of Classification Search ............ 372/50.121, 372/50.1
See application file for complete search history.

(56) References Cited

U.S. PATENT DOCUMENTS

| 5,212,706 | A |   | 5/1993  | Jain |   |
|---|---|---|---|---|---|
| 5,365,536 | A |   | 11/1994 | Seki |   |
| 5,663,975 | A | * | 9/1997  | Yoshida et al. | ........... 372/46.01 |
| 5,832,019 | A | * | 11/1998 | Paoli et al. | ............. 372/46.016 |
| 6,487,230 | B1 |  | 11/2002 | Boucart et al. |   |
| 6,584,130 | B2 | * | 6/2003  | Hanke | ........................ 372/50.1 |
| 6,956,881 | B2 | * | 10/2005 | Behringer et al. | ........ 372/43.01 |
| 2006/0233213 | A1 |  | 10/2006 | Choa et al. |   |

FOREIGN PATENT DOCUMENTS

DE    199 35 998    2/2001

(Continued)

OTHER PUBLICATIONS

J. Ch. Garcia et al., "Epitaxially stacked lasers with Esaki junctions: A bipolar cascade laser", Appl. Phys. Lett., vol. 71, No. 26, pp. 3752-3754, Dec. 29, 1997.

(Continued)

*Primary Examiner*—Minsun Harvey
*Assistant Examiner*—Kinam Park
(74) *Attorney, Agent, or Firm*—Cohen Pontani Lieberman & Pavane LLP

(57) ABSTRACT

An edge emitting semiconductor laser containing a plurality of monolithically integrated laser diodes (1, 2, 3). Each laser diode (1, 2, 3) contains an active zone (11, 12, 13), with the active zones (11, 12, 13) being in each case arranged between waveguide layers (6), the waveguide layers (6) in each case adjoining a cladding layer (7, 8) at a side remote from the active zone (11, 12, 13). The cladding layers (7, 8) comprise inner cladding layers (7), which are arranged above a bottommost active zone (11) and below a topmost active zone (13), and outer cladding layers (8) which are arranged below the bottommost active zone (11) or above the topmost active zone (13). The inner cladding layers (7) have a smaller thickness than the outer cladding layers (8).

15 Claims, 2 Drawing Sheets

FOREIGN PATENT DOCUMENTS

DE             199 54 093         5/2001

OTHER PUBLICATIONS

F. Dross et al., "Single-Transverse-Mode InGaAsP-InP Edge-Emitting Bipolar Cascade Laser", IEEE Journal of Quantum Electronics, vol. 41, No. 11, pp. 1356-1360, Nov. 2005.

F. Dross et al., "Optimization of Large Band-Gap Barriers for Reducing Leakage in Bipolar Cascade Lasers", IEEE Journal of Quantum Electronics, vol. 40, No. 8, pp. 1003-1007, Aug. 8, 2004.

Cui Bi-Feng et al.: "Thermal Characterization of High-Power Laser Diode Cascaded by Tunnel Junction", Journal of Functional Materials and Devices Editorial Board, J. funct. mater. Devices China, Mar. 2004, vol. 10, No. 1, pp. 87-89.

Dross F. et al.: "Improved Bipolar Cascade Laser Characteristics by Optimization of InP Electron Stopper Layers", Indium Phosphide and Related Materials, 2004, 16$^{th}$ IPRM. 2004, International Conference on Kogoshima, Japan, pp. 400-402.

Dross F. et al.: "Transverse Mode Analysis of Bipolar Cascade Laser", Laser and Electro-optics Europe, 2003, Cleo/Europe, Conference on Munich, Germany, Jun. 22-27, 2003 p. 155.

Lu Peng-Cheng et al.: "Transient Thermal Characteristic Analysis of Tunnel Regeneration High-Power Semiconductor Laser", Zhongguo Jiguang; Zhongguo Jiguang/Chinese Journal of Lasers, May 2004, vol. 31, No. 5, pp. 518-522.

Shellenbarger Z. A. et al.: "Development of 1550 nm Bipolar Cascade Lasers", Indium Phosphide and Related Materials, 2005, International Conference on Glasgow, Scotland, May 8-12, 2005, pp. 295-298.

Skeldon M.D.: "A Design Approach for a Thermally Compensated Injection Laser Stack Transmitter/Receiver", Optical Engineering, Soc. of Photo-Optical Instrumentation Engineers, Bellingham, US, vol. 21, No. 6, Nov. 1982, pp. 1046-1050.

* cited by examiner

EDGE EMITTING SEMICONDUCTOR LASER COMPRISING A PLURALITY OF MONOLITHICALLY INTEGRATED LASER DIODES

RELATED APPLICATIONS

This patent application claims the priority of German Patent Applications 10 2006 046 036.7 filed Sep. 28, 2006 and 10 2006 061 532.8 filed Dec. 27, 2007, the disclosure content of both of which is hereby incorporated by reference.

FIELD OF THE INVENTION

The invention relates to an edge emitting semiconductor laser comprising a plurality of monolithically integrated laser diodes, each laser diode containing an active zone.

BACKGROUND OF THE INVENTION

In order to achieve high optical output powers in edge emitting semiconductor lasers it is known to monolithically integrate a plurality of laser diodes in a layer stack. By way of example, the document U.S. Pat. No. 5,212,706 discloses an edge emitting semiconductor laser in which a plurality of laser diodes are monolithically deposited one above another and the laser diodes are connected to one another by means of tunnel junctions.

The comparatively large thickness of the layer stack of such an edge emitting semiconductor laser comprising a plurality of monolithically integrated laser diodes adversely affects the thermal conduction. The heat dissipation of the heat generated by the laser diodes is therefore made more difficult in comparison with a simple semiconductor laser.

Furthermore, there can be the problem that the active zones of the laser diodes arranged one above another have at least slightly different temperatures during the operation of the edge emitting semiconductor laser. This can lead to undesirable differences in the emission wavelengths of the individual laser diodes.

Since a comparatively thick layer stack is deposited in the case of an edge emitting semiconductor laser comprising a plurality of monolithically integrated laser diodes, production involves a comparatively high outlay.

SUMMARY OF THE INVENTION

One object of the present invention is to provide an edge emitting semiconductor laser comprising a plurality of monolithically integrated laser diodes which is distinguished in particular by an improved heat dissipation of the heat generated by the individual laser diodes, a reduced temperature difference of the active zones of the laser diodes and a comparatively low production outlay.

This and other objects are attained in accordance with an aspect of the present invention directed to an edge emitting semiconductor laser containing a plurality of monolithically integrated laser diodes, each laser diode containing an active zone. The active zones are in each case arranged between waveguide layers. The waveguide layers in each case adjoining a cladding layer at a side remote from the active zone. The cladding layers comprise inner cladding layers, which are arranged above a bottommost active zone and below a topmost active zone, and outer cladding layers, which are arranged below the bottommost active zone or above the topmost active zone. The inner cladding layers have a smaller thickness than the outer cladding layers.

In the case of the edge emitting semiconductor laser, therefore, the active layers are in each case embedded in waveguide layers, whereby the laser radiation emitted by the active zones of the laser diodes is guided in a lateral direction. The waveguide arises as a result of a refractive index jump between the waveguide layers and the adjoining cladding layers, the cladding layers typically having a smaller refractive index than the waveguide layers. On account of the finite refractive index difference, however, the radiation field of the semiconductor laser penetrates at least partly into the cladding layers. In order to reduce absorption losses in the layers adjoining the cladding layers, for example a growth substrate or contact layers, the cladding layers in conventional semiconductor lasers are comparatively thick layers having a thickness of typically approximately 1 μm to 2 μm.

By virtue of the fact that, in the case of the semiconductor laser according to an embodiment of the invention, the inner cladding layers arranged between the bottommost active zone and the topmost active zone have a smaller thickness than the outer cladding layers arranged for example between a substrate and the bottommost active zone and between the topmost active zone and a contact layer provided for electrical contact-connection, the thickness of the layer stack composed of the plurality of laser diodes is reduced. On account of the reduced layer thicknesses of the inner cladding layers, the thermal resistance of said layers also becomes smaller, whereby more efficient cooling of the edge emitting semiconductor laser is made possible. Furthermore, the inner cladding layers also have a smaller electrical resistance on account of the reduced layer thicknesses, whereby the heating of the edge emitting semiconductor laser during operation is likewise reduced.

Furthermore, the deposition time required for depositing the layer stack is shortened on account of the reduced layer thicknesses of the inner cladding layers, whereby the time requirement and material requirement are reduced and the production costs are thus reduced.

On account of the reduced thermal resistance of the inner cladding layers, the temperature differences between the plurality of active zones are smaller than if the inner cladding layers were deposited with the same thickness as the outer cladding layers.

Furthermore, the strains that occur within the layer stack are also reduced as a result of the reduced layer thicknesses of the inner cladding layers. The smaller strains that occur as a result of the reduced layer thicknesses of the inner cladding layers advantageously enable the monolithic integration of a larger number of laser diodes than in conventional edge emitting semiconductor lasers comprising a plurality of monolithically integrated laser diodes. In particular, the edge emitting semiconductor laser can have four or more laser diodes particularly preferably even five or more laser diodes.

Furthermore, the current spreading within the layer stack is reduced as a result of the comparatively small thickness of the inner cladding layers, that is to say that the current flow through the layer stack takes place essentially through a region of the layer stack which is provided with a preferably structured contact layer. By way of example, the current flow can be delimited to a strip-shaped region of the layer stack by means of a contact structured in strip-shaped fashion. The laser threshold is advantageously reduced as a result of this.

In one advantageous embodiment of the invention, the inner cladding layers are thinner than the outer cladding layers by at least a factor of 2.

Preferably, the inner cladding layers are thinner than the outer cladding layers by at least a factor of 5, particularly preferably even by a factor of 10.

The inner cladding layers preferably in each case have a thickness of 300 nm or less. Particularly preferably, the thickness of the inner cladding layers is even 100 nm or less. The thickness of the inner cladding layers is therefore advantageously significantly smaller than the thickness of the cladding layers in conventional edge emitting semiconductor lasers, which is approximately 1 μm to 2 μm.

The outer cladding layers in each case have a thickness of 500 nm or more, or preferably of 1 μm or more. The comparatively thick outer cladding layers reduce an absorption of the emitted laser radiation in a substrate, which is used for example for the growth of the layer stack and in a contact layer, which is applied for example at a surface of the layer stack opposite to the substrate for the purpose of making electrical contact with the edge emitting semiconductor laser.

The edge emitting semiconductor laser can have two or three laser diodes, for example. In particular, it is also possible, however, for the edge emitting semiconductor laser to have four or more, preferably even five or more, laser diodes. The arrangement of a multiplicity of monolithically integrated laser diodes in the layer stack of the edge emitting semiconductor laser is facilitated by the reduced thickness of the inner cladding layers since the smaller thicknesses reduce layer stresses that could lead, in the case of a multiplicity of monolithically integrated laser diodes, to an impairment of the layer quality or even to the destruction of the layer stack. Moreover, deviations of the emission wavelengths of the individual laser diodes, which could occur in the layer stack as a result of slightly different temperatures of the individual active zones, are reduced by the comparatively thin inner cladding layers.

The active zones of the plurality of laser diodes preferably have a quantum well structure, in particular a single quantum well structure. Furthermore, the quantum well structure can also be a multiple quantum well structure. In the context of the application, the designation quantum well structure encompasses any structure in which charge carriers experience a quantization of their energy states as a result of confinement. In particular, the designation quantum well structure does not comprise any indication about the dimensionality of the quantization. It therefore encompasses, inter alia, quantum wells, quantum wires and quantum dots and any combination of these structures.

In one preferred embodiment of the invention, the single or multiple quantum well structures of the plurality of active zones differ from one another in terms of their layer thicknesses and/or their material compositions. By way of example, an edge emitting semiconductor laser with a broadband emission spectrum can be realized in this way.

In a particularly preferred embodiment, the single or multiple quantum well structures of the plurality of active zones differ from one another in terms of their layer thicknesses and/or their material compositions in such a way that a difference between the wavelengths of the radiation emitted by the plurality of active zones, said difference being brought about by temperature differences of the plurality of active zones, is reduced or even entirely compensated for. This is advantageous in particular if a laser beam having a very small spectral width is desired, and, despite the already reduced temperature differences between the different active zones on account of the reduced thickness of the inner cladding layers, there was still slight temperature-dictated deviations between the emission wavelengths of the active zones.

In one preferred embodiment, the laser diodes are connected to one another by tunnel junctions. The mode spectrum and hence the intensity distribution depending on the emission angle is influenced by the tunnel junctions, which have an absorbing effect for the emitted radiation. On account of the reduced layer thickness of the inner cladding layers in comparison with conventional semiconductor lasers, it cannot be ruled out that the beam quality of the edge emitting semiconductor laser will be influenced by a coupling of the radiation of the plurality of active zones.

It has been found, however, that the beam quality that can be obtained despite the reduced layer thickness of the inner cladding layers is sufficient for many applications of an edge emitting semiconductor laser. This applies in particular to applications in which a comparatively high integral radiation intensity is desired, and the beam profile has only a secondary importance. A semiconductor laser according to the invention can be used, for example, for optically pumping fibers.

In order to reduce an absorption of laser radiation that is brought about by the reduced thicknesses of the cladding layers in the tunnel junctions, it is advantageous if the tunnel junctions are embodied with a small layer thickness. The tunnel junctions advantageously have a layer thickness of 40 nm or less. Furthermore, it is advantageous if the inner cladding layers in each case have a thickness of at least 10 nm. In the case of an even further reduction of the thickness of the inner cladding layers, a considerable absorption of the laser radiation emitted by the active zones would otherwise take place in the tunnel junctions.

In a further preferred embodiment, the waveguide layers have different thicknesses and/or differ in terms of their material compositions. In this way, the mode spectrum of the semiconductor laser can be influenced. In particular, what can be achieved by means of a suitable setting of the layer thicknesses of the waveguide layers is that the laser radiation is emitted in a desired laser mode. The selection of suitable layer thicknesses and/or material compositions for the waveguide layers and/or the cladding layers is preferably effected on the basis of simulation calculations. In particular, the far field angle, that is to say the angle at which the laser radiation is emitted in the far field, can be reduced by a suitable selection of the layer thicknesses and/or the material compositions.

DETAILED DESCRIPTION OF THE DRAWINGS

Figure 1:
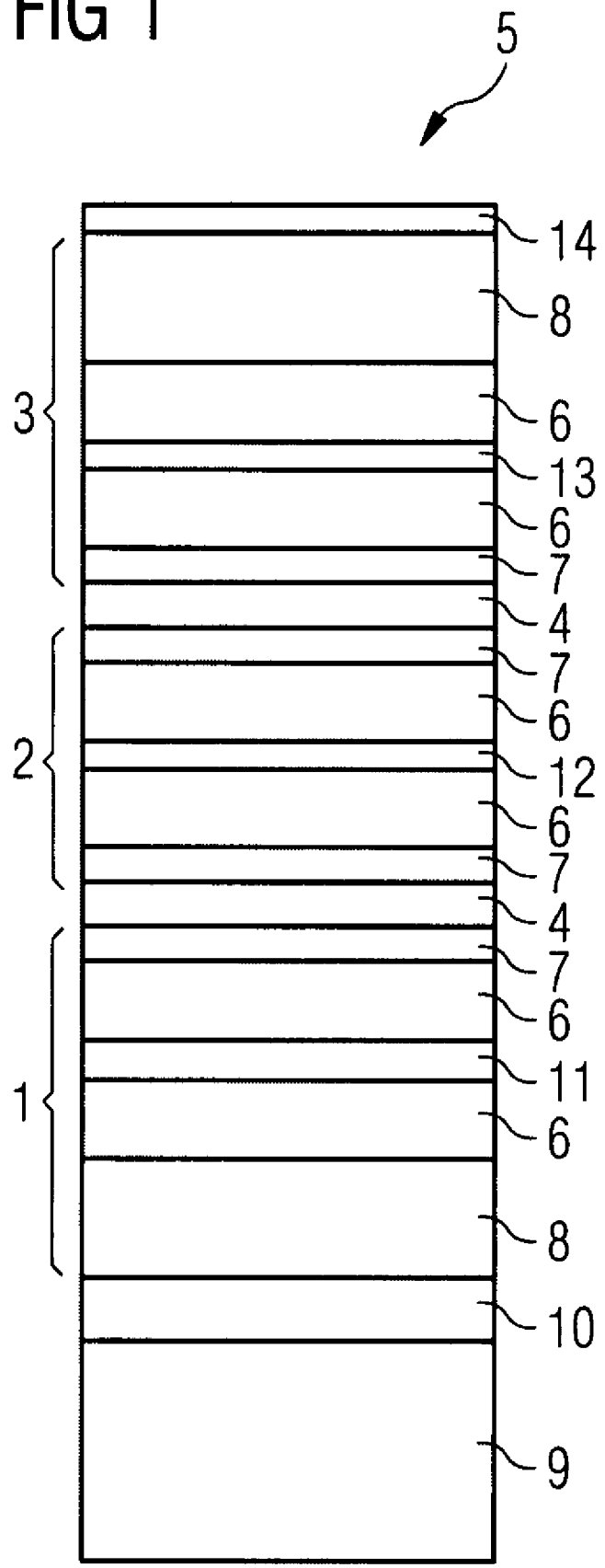
FIG. 1 shows a schematic graphical illustration of a cross section through an edge emitting semiconductor laser in accordance with an exemplary embodiment of the invention.

The exemplary embodiment of an edge emitting semiconductor laser according to the invention as illustrated in FIG. 1 contains three monolithically integrated laser diodes 1, 2, 3. The laser diodes 1, 2, 3 are contained in a common layer stack 5 which is grown for example on a substrate 9.

The monolithically integrated laser diodes 1, 2, 3 are connected to one another by tunnel junctions 4. In the exemplary embodiment, a tunnel junction 4 is contained between the bottommost laser diode 1 and the subsequent laser diode 2. A further tunnel junction 4 is contained between the laser diode 2 and the topmost laser diode 3.

Each of the monolithically integrated laser diodes contains an active zone 11, 12, 13, which can be formed in particular from a quantum well structure. The active zones 11, 12, 13 are in each case arranged between two waveguide layers 6 which in each case adjoin the active zones 11, 12, 13.

In each of the monolithically integrated laser diodes 1, 2, 3, the waveguide layers 6 surrounding the active zones 11, 12, 13 in each case adjoin cladding layers 7, 8. By way of example, the bottommost laser diode 1 contains a first cladding layer 8, a first waveguide layer 6 arranged on the first cladding layer 8, an active zone 11 arranged on the first waveguide layer 6, a second waveguide layer 6 arranged on the active zone 11, and a second cladding layer 7 arranged on the second waveguide layer 6. Adjacent to the second cladding layer 7 of the laser diode 1 is a tunnel junction 4, on which the corresponding layers of the second laser diode 2 are arranged. The laser diode 2 is followed by the third laser diode 3, a further tunnel junction 4 being arranged between the laser diode 2 and the laser diode 3.

In the edge emitting semiconductor laser according to the invention, the inner cladding layers 7 have a smaller thickness than the outer cladding layers 8.

The inner cladding layers are in this case understood to mean those of the cladding layers 7 contained within the layer stack 5 which are arranged above the active layer 11 of the bottommost laser diode 1 and below the active layer 13 of the topmost laser diode 3.

The outer cladding layers 8 are firstly the cladding layer 8 arranged below the active zone 11 of the bottommost laser diode 1, and secondly the cladding layer 8 arranged above the active zone 13 of the topmost laser diode 3.

The outer cladding layers 8 preferably have a thickness of between 500 nm and 2 μm inclusive. By way of example, the two outer cladding layers 8 can in each case have a thickness of approximately 1300 nm.

The inner cladding layers 7 preferably have a thickness of 300 nm or less, particularly preferably of 100 nm or less. By way of example, the inner cladding layers 7 can in each case have a thickness of 50 nm.

The comparatively small layer thicknesses of the inner cladding layers 7, which are thinner than the outer cladding layers 8 in particular by a multiple, have the advantage that the thermal resistance of the layer stack 5 is reduced. The heat generated by the edge emitting semiconductor laser can therefore be dissipated efficiently via the substrate 9. By way of example, the edge emitting semiconductor laser can be mounted onto a heat sink at an underside of the substrate 9.

Furthermore, strains that occur in the layer stack 5 are reduced by the comparatively thin inner cladding layers 7. By way of example, a total thickness of the layer stack 5 with the four inner cladding layers 7 contained therein, which in each case have a thickness of only 50 nm, is 5 μm thinner than a corresponding layer stack in which the inner cladding layers 7 would be embodied with the same layer thickness as the outer cladding layers 8, which is 1300 nm for example.

Furthermore, the thin inner cladding layers 7 have the advantage that the active zones 11, 12, 13 of the laser diodes 1, 2, 3 are at a comparatively small distance. Temperature differences of the active zones 11, 12, 13 which might lead to differences in the emission wavelengths are advantageously reduced as a result.

On account of the abovementioned advantages of the thinner inner waveguide layers 7 the layer stack 5 can also have a greater number of laser diodes than three. This is advantageous in particular if a high radiation power is desired.

On account of the comparatively thin inner cladding layers 7 it is possible for part of the radiation emitted in the active zones 11, 12, 13 to penetrate into the regions of the tunnel junctions 4. In order that absorption losses occurring as a result are kept small, the inner cladding layers 7 are preferably not thinner than 10 nm.

Furthermore, in order to avoid absorption losses in the tunnel junctions 4, it is advantageous for the tunnel junctions also to be made comparatively thin. In particular, the thickness of the tunnel junctions can be 40 nm or less.

The active zones 11, 12, 13 of the laser diodes 1, 2, 3 are advantageously embodied as a single or multiple quantum well structure. Quantum well structures of this type contain for example a multiplicity of alternate layers whose material composition and layer thicknesses are selected in a manner dependent on the desired emission wavelength of the semiconductor laser.

In one embodiment of the invention, the quantum well structures differ from one another in terms of their layer thicknesses and/or their material composition. What can be achieved in this way is, for example, that the plurality of monolithically integrated laser diodes 1, 2, 3 have different emission wavelengths.

As an alternative, it is also possible for the quantum well structures to differ from one another in terms of their layer thicknesses and/or their material compositions in such a way that differences in the emission wavelength that are brought about on account of different temperatures of the active zones 11, 12, 13 of the individual laser diodes 1, 2, 3 are reduced or even entirely compensated for.

In a further advantageous variant, the waveguide layers 6 have different layer thicknesses and/or material compositions. The respective layer thicknesses of the waveguide layers 6 can be modified, for example, in such a way that the semiconductor laser builds up oscillations in a desired laser mode. The respectively required layer thicknesses for the waveguide layers 6 can be determined before the deposition of the layer stack 5 in each case on the basis of simulation calculations. By modifying the thickness of the waveguide layers 6, it is also possible to alter an emission angle of the edge emitting semiconductor laser.

The substrate 9 is preferably a conductive substrate, for example a doped semiconductor substrate. In particular, the substrate 9 can be an n-doped substrate. In this case, the substrate 9 advantageously constitutes a first electrically conductive contact for the edge emitting semiconductor laser. A further electrical contact 14 is applied, for example, to a surface of the layer stack 5 that is opposite to the substrate. In particular, the contact layer 14 can be a p-type contact layer.

The substrate 9, on which the layer stack 5 is grown, is preferably provided with a buffer layer 10, which, with regard to the layer quality and the lattice constant, forms a growth surface suitable for the epitaxial growth of the layer stack 12 containing the laser diodes 1, 2, 3. The buffer layer 10 can have for example a thickness of approximately 500 nm.

The material selection for the layer stack 5, in particular for the active zones 13, 14, 15 contained therein, is effected on the basis of the desired emission wavelength of the semiconductor laser. The layer stack 5 is preferably based on a III-V compound semiconductor material, in particular on an arsenide, nitride or phosphide compound semiconductor material. By way of example the layer stack 5 can contain $In_xAl_yGa_{1-x-y}N$, $In_xAl_yGa_{1-x-y}P$ or $In_xAl_yGa_{1-x-y}As$, in each case where $0 \leq x \leq 1$, $0 \leq y \leq 1$ and $x+y \leq 1$. In this case, the III-V compound semiconductor material need not necessarily have a mathematically exact composition according to one of the above formulae. Rather, it can have one or a plurality of dopants and also additional constituents which do not substantially change the physical properties of the material. For the sake of simplicity, however, the above formulae only comprise the essential constituents of the crystal lattice, even though these can be replaced in part by small quantities of further substances.

Figure 2:
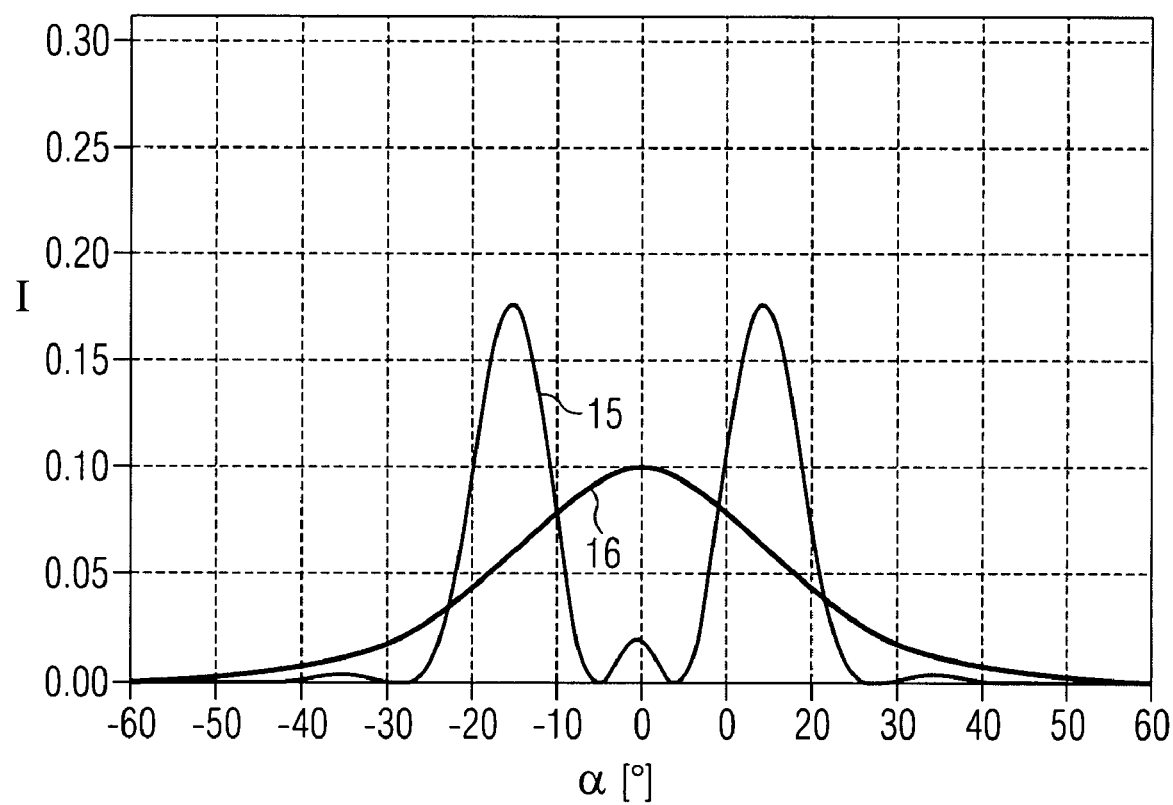
FIG. 2 shows a graphical illustration of the beam profile of an edge emitting semiconductor laser in accordance with an exemplary embodiment of the invention in comparison with a conventional edge emitting semiconductor laser.

FIG. 2 illustrates the beam profile (curve 15) of an exemplary embodiment of an edge emitting semiconductor laser according to the invention, in which the inner cladding layers have a thickness of only 150 nm, in comparison with the beam profile (curve 16) of a conventional semiconductor laser, in which the inner cladding layers have a layer thickness of 1.35 µm. In each case the intensity I in the far field of the semiconductor laser (in arbitrary units) is plotted against the emission angle $\alpha$ measured with respect to the main emission direction.

The conventional semiconductor laser has a single intensity maximum in the main emission direction, that is to say at $\alpha=0°$. By contrast, the beam profile of the semiconductor laser according to the invention has two pronounced intensity maxima, which occur on both sides of the main emission direction at an angle $\alpha$ of approximately 15° in each case. As a result of the small thicknesses of the inner cladding layers, therefore, the beam profile in the far field changes in comparison with a conventional semiconductor laser having comparatively thick inner waveguide layers.

Such a beam profile can be disadvantageous for applications in which a small beam width is desired. It has been found, however, that the integral intensity which is emitted overall into an emission angle range of 50° is greater in the case of the semiconductor laser according to the invention than in the case of the conventional semiconductor laser having comparatively thick waveguide layers. Therefore, the semiconductor laser according to the invention is suitable in particular for applications in which the integral intensity has greater importance than the beam profile.

The invention is not restricted by the description on the basis of the exemplary embodiments. Rather, the invention encompasses any new feature and also any combination of features, which in particular comprises any combination of features in the patent claims, even if this feature or this combination itself is not explicitly specified in the patent claims or exemplary embodiments.

We claim:

1. An edge emitting semiconductor laser comprising a plurality of monolithically integrated laser diodes, each laser diode containing an active zone, wherein the active zones are in each case arranged between waveguide layers;

wherein the waveguide layers in each case adjoin a cladding layer at a side remote from the active zone, the cladding layers comprising inner cladding layers, which are arranged above a bottommost active zone and below a topmost active zone, and outer cladding layers, which are arranged below the bottommost active zone or above the topmost active zone; and wherein the inner cladding layers have a smaller thickness than the outer cladding layers.

2. The edge emitting semiconductor laser as claimed in claim 1, wherein the inner cladding layers are thinner than the outer cladding layers by at least a factor of 2.

3. The edge emitting semiconductor laser as claimed in claim 2, wherein the inner cladding layers are thinner than the outer cladding layers by at least a factor of 5.

4. The edge emitting semiconductor laser as claimed in claim 1, wherein the inner cladding layers each have a thickness of 300 nm or less.

5. The edge emitting semiconductor laser as claimed in claim 4, wherein the inner cladding layers each have a thickness of 100 nm or less.

6. The edge emitting semiconductor laser as claimed in claim 1, wherein the inner cladding layers each have a thickness of 10 nm or more.

7. The edge emitting semiconductor laser as claimed in claim 1, wherein the outer cladding layers each have a thickness of 500 nm or more.

8. The edge emitting semiconductor laser as claimed in claim 7, wherein the outer cladding layers each have a thickness of 1 µm or more.

9. The edge emitting semiconductor laser as claimed in claim 1, wherein a number of the monolithically integrated laser diodes is four or more.

10. The edge emitting semiconductor laser as claimed in claim 1, wherein the active zones each have a quantum well structure.

11. The edge emitting semiconductor laser as claimed in claim 10, wherein the quantum well structures of the active zones differ from one another in terms of at least one of their layer thicknesses and their material compositions.

12. The edge emitting semiconductor laser as claimed in claim 11, wherein the quantum well structures of the active zones differ from one another in terms of at least one of their layer thicknesses and their material compositions to reduce or entirely compensate for a difference between wavelengths of radiation emitted by the active zones, said difference being brought about by temperature differences of the active zones.

13. The edge emitting semiconductor laser as claimed in claim 1, wherein said plural monolithically integrated laser diodes are interconnected by tunnel junctions.

14. The edge emitting semiconductor laser as claimed in claim 13, wherein the tunnel junctions each have a thickness of 40 nm or less.

15. The edge emitting semiconductor laser as claimed in claim 1, wherein the waveguide layers differ from one another in terms of at least one of their layer thicknesses and their material compositions.

* * * * *